(12) United States Patent
Meng et al.

(10) Patent No.: US 8,950,886 B2
(45) Date of Patent: Feb. 10, 2015

(54) SOLAR-POWERED LIGHTING MODULE

(75) Inventors: Ying S. Meng, San Diego, CA (US);
Karl R. Zawoy, High Springs, FL (US);
Jiangeng Xue, Gainesville, FL (US);
Franky So, Gainesville, FL (US); John
R. Reynolds, Gainesville, FL (US)

(73) Assignee: University of Florida Research
Foundation, Inc., Gainesville, FL (US)

( * ) Notice: Subject to any disclaimer, the term of this
patent is extended or adjusted under 35
U.S.C. 154(b) by 219 days.

(21) Appl. No.: 13/319,981

(22) PCT Filed: Jun. 2, 2010

(86) PCT No.: PCT/US2010/037063
§ 371 (c)(1),
(2), (4) Date: Jan. 31, 2012

(87) PCT Pub. No.: WO2010/141580
PCT Pub. Date: Dec. 9, 2010

(65) Prior Publication Data
US 2012/0120643 A1 May 17, 2012

Related U.S. Application Data

(60) Provisional application No. 61/183,359, filed on Jun. 2, 2009.

(51) Int. Cl.
H01L 31/00 (2006.01)
F21S 9/03 (2006.01)
B82Y 10/00 (2011.01)
E06B 9/24 (2006.01)
(Continued)

(52) U.S. Cl.
CPC ............. *F21S 9/037* (2013.01); *B82Y 10/00* (2013.01); *E06B 9/24* (2013.01); *H01L 27/281* (2013.01); *H01L 27/288* (2013.01); *H01L 27/3232* (2013.01); *E06B 2009/2464* (2013.01); *E06B 2009/247* (2013.01); *E06B 2009/2476* (2013.01); *H01L 51/0036* (2013.01); *H01L 51/0047* (2013.01); *H01L 51/4253* (2013.01); *H01L 2251/5323* (2013.01); *H01L 2251/5361* (2013.01)
USPC ............. 362/183; 362/84; 313/504; 313/506; 136/244

(58) Field of Classification Search
USPC ........................................................ 362/183
See application file for complete search history.

(56) References Cited

U.S. PATENT DOCUMENTS 5,384,653 A * 1/1995 Benson et al. ................ 359/270
5,818,636 A * 10/1998 Leventis et al. .............. 359/273
(Continued)

Primary Examiner — Sikha Roy
(74) Attorney, Agent, or Firm — Saliwanchik, Lloyd & Eisenschenk

(57) ABSTRACT

A solar-powered lighting module is provided, including a solar cell for generating electricity when exposed to light, a battery for storing charge from the generated electricity, and a light generating device powered by the stored charge. In an embodiment, the module further includes a controller that regulates the current transmitted between the components of the module. In a further embodiment, the module is incorporated into an interface to an environmentally controlled space and can be positioned to light an interior portion of the space. In another embodiment, the solar cell and light generating device are transparent to allow light to pass through the interface. In a further embodiment, tinted-color conjugated polymers incorporated into the module limit the spectrum of light that can pass through the interface. In yet another embodiment, a method of modifying an existing interface with such a module is provided.

49 Claims, 7 Drawing Sheets

(51) Int. Cl.
  *H01L 27/28* (2006.01)
  *H01L 27/32* (2006.01)
  H01L 51/00 (2006.01)
  H01L 51/42 (2006.01)

(56) References Cited

U.S. PATENT DOCUMENTS

| | | | |
|---|---|---|---|
| 6,356,031 B1* | 3/2002 | Thagard et al. | 315/169.3 |
| 8,358,064 B2* | 1/2013 | Seaman | 313/507 |
| 8,399,889 B2* | 3/2013 | Wu et al. | 257/80 |
| 2003/0081158 A1 | 5/2003 | Li et al. | |
| 2005/0023975 A1* | 2/2005 | Lee et al. | 313/512 |
| 2006/0130894 A1 | 6/2006 | Gui et al. | |
| 2007/0171148 A1* | 7/2007 | Cassidy | 345/49 |
| 2008/0272689 A1* | 11/2008 | Ide et al. | 313/504 |
| 2008/0278792 A1* | 11/2008 | Jang et al. | 359/266 |
| 2009/0009103 A1 | 1/2009 | McKechnie et al. | |
| 2009/0096360 A1* | 4/2009 | Tanaka et al. | 313/504 |
| 2009/0288700 A1* | 11/2009 | Lifka et al. | 136/251 |
| 2010/0294330 A1* | 11/2010 | Huang et al. | 136/244 |
| 2011/0108856 A1* | 5/2011 | Wu et al. | 257/80 |

* cited by examiner

SOLAR-POWERED LIGHTING MODULE

CROSS-REFERENCE TO RELATED APPLICATION APPLICATIONS

The present application is the U.S. National Stage Application of International Application Serial No. PCT/US2010/037063, filed Jun. 2, 2010, which claims the benefit of U.S. Provisional Application Ser. No. 61/183,359, filed Jun. 2, 2009, both of which are hereby incorporated by reference herein in their entirety, including any figures, tables, or drawings.

GOVERNMENT SUPPORT

The subject invention was made with government support under a research project supported by Florida Energy Systems Consortium, Contract No. 00080583. The government has certain rights to this invention.

BACKGROUND OF INVENTION

Lighting is the second largest end-use of energy in buildings. Energy consumption for all lighting in the U.S. is estimated to be 8.2 quads, or about 22% of the total electricity generated in the U.S. According to the Department of Energy Solid State Lighting Program Multi-Year Program Plan, more than half of these 8.2 quads are consumed in the commercial sector, the largest energy user for lighting. Nationally, in the residential and commercial sectors, lighting constitutes over 30% of total electricity use. Inefficient lighting not only impacts the electricity directly consumed due to lighting, it also affects overall electricity consumption because inefficient lighting sources contribute to a building's internal heat generation and subsequent air-conditioning loads. In both the residential and commercial sectors, incandescent light bulbs account for almost 50% of the sources of lighting. These incandescent light bulbs are extremely inefficient, with more than 90% of the energy consumed contributing to heat generation. Therefore, the actual amount of electricity consumed due to light generation is substantially higher than 22%.

Organic Light Emitting Devices (OLEDs) have demonstrated very high efficiency. Recently, several groups have demonstrated that OLEDs can achieve a luminous efficiency exceeding 100 lm/W, which corresponds to about 7 times the efficiency of conventional incandescent light bulbs and 2 times the efficiency of fluorescent light tubes. OLEDs are extended light sources that do not require luminaries, but these devices are often still attached to the power-grid.

Organic solar cells are promising as a new source of renewable energy. Organic solar cells are attractive for the next generation photovoltaics because of their compatibility with flexible substrates, low manufacturing costs, and large area applications. Specifically, organic solar cells made with polymers can be printed on plastic substrates at very low costs by roll-to-roll processes. Typically, solar cells are semi-transparent instead of "black" compared with typical inorganic solar cells. The color appearance of polymers can also be varied by modifying their molecular design. As a result, organic solar cell-coated windows can be used for energy harvesting as well as for window tinting applications. However, a large area is often used for solar cell applications and the power generated is typically converted for immediate use or efficiently stored.

Thus, an off-grid lighting solution that maximizes energy storage and conversion efficiency, while fitting into currently available building space, can be useful.

BRIEF SUMMARY

Embodiments of the invention are directed to high-efficiency, solar-powered lighting. In an embodiment, a light generating device is provided. In a separate embodiment, the light generating device is an organic light emitting diode (OLED). In another embodiment, a power generation device is provided. In a particular embodiment, the power generation device incorporates a solar cell. In yet another embodiment, an energy storage device is provided. In a particular embodiment, the energy storage device includes a battery. A preferred embodiment incorporates at least one solar cell for absorbing sunlight and generating an electrical current; at least one lithium ion battery, which can be charged by the solar cell; and at least one OLED, which can be powered by the lithium ion battery and generate light. In a further preferred embodiment, such an apparatus can be an interface between a space receiving sunlight and a space to be lighted.

In an embodiment, a solar-powered lighting module is provided, including a solar cell for generating electricity when exposed to light, and a light generating device capable of being powered by the generated electricity. In a further embodiment, the module further includes a battery for storing charge from the generated electricity. In a further embodiment, the module further includes a controller that regulates the current transmitted between the components of the module. As the lighting provided by the module can be, at least partially, solar-powered, use of the module can reduce the amount of electricity needed for lighting commercial and residential buildings.

In an embodiment, an electricity generation module is provided, including a solar cell for generating electricity when exposed to light and a battery for storing charge from the generated electricity.

In another embodiment, a battery powered lighting module is provided, including a light generating device and a battery for powering the light generating device.

In further embodiments, a module, such as one or more of the modules discussed above or throughout the subject application, can serve as an interface between two environments. In a specific embodiment, a module can serve as an interface between the inside and outside of an environmentally controlled space. In an embodiment, the module is incorporated into a building interface, such as a window, skylight, or other interface, and can be positioned to light an interior portion of the building. In another embodiment, the solar cell and light generating device can be, partially or wholly, transparent to allow light to pass through the interface. In a further embodiment, tinted-color conjugated polymers incorporated into the module limit the spectrum of light that can pass through the interface. In an embodiment, the interface provides good thermal insulation and low sunlight transmission that further reduce the electricity required for heating and air conditioning the controlled space.

An embodiment relates to a method of manufacturing one or more modules, such as the modules discussed above or throughout the subject application. In a further embodiment, the one or more modules are incorporated into an interface.

Another embodiment relates to a method of modifying an existing interface, wherein one or more modules, such as the modules discussed above or throughout the subject application, are incorporated into the existing interface.

One or more modules, such as the modules discussed above or throughout the subject application, can be incorporated into a surface of an appliance, fixture, or work space.

Additional embodiments relate to systems and/or methods of generating electricity and/or providing lighting using one or modules, such as the modules discussed above. In an embodiment, the one or more modules are used to light a space. In an embodiment, the one or more modules are incorporated into an interface. In a further embodiment, the interface is an interface between two environments and the one or more modules are used to provide lighting in one of the two environments. In an embodiment, the one or more modules are used to provide lighting to both environments.

In an embodiment, the operation of the system and/or method is varied based on the presence or absence of one or more conditions. Various conditions can affect the operation of the system and/or method. For example, one or more conditions existing in the two environments separated by the interface can affect the operation of the system and/or method. At least one sensor can be used to sense the one or more conditions. Such sensors can sense a variety of conditions, such as temperature, humidity, lighting, acidity, proximity of an object to a part of the system, presence or movement of an object, among other conditions. Other sensors for sensing various conditions are known in the art and can be used with the subject invention.

Embodiments can relate to an apparatus, and/or a method utilizing an apparatus, incorporating: an exposed surface, where the exposed surface is capable of allowing electromagnetic radiation in a first wavelength range to enter the apparatus; at least one photovoltaic cell, where at least one photovoltaic cell is capable of generating electrical current when electromagnetic radiation in the first wavelength range enters through the exposed surface and is incident on the at least one photovoltaic cell; at least one battery, where the at least one battery is operably connected to the at least one photovoltaic cell and capable of storing electrical charge from the electrical current generated by the at least one photovoltaic cell; and a light generating device, where the light generating device is operably connected to the at least one battery and capable of emitting electromagnetic radiation in a second wavelength range when powered by the at least one battery, where the apparatus is capable of having at least a first portion of the electromagnetic radiation in the second wavelength range exit the apparatus via a second surface.

If desirable, the apparatus can be capable of having at least a second portion of the electromagnetic radiation in the second wavelength range exit the apparatus via the exposed surface. Preferably, at least a portion of the at least one photovoltaic cell is at least semi-transparent such that a portion of electromagnetic radiation in the first wavelength range incident on the at least a portion of the at least one photovoltaic cell passes through the at least a portion of the at least one photovoltaic cell. The first wavelength range can be at least a portion of the sun's spectrum. Preferably, the first wavelength range is a significant portion of the sun's spectrum.

An embodiment is an apparatus, comprising an exposed surface, where the exposed surface is capable of allowing electromagnetic radiation in a first wavelength range to enter the apparatus; at least one photovoltaic cell, where at least one photovoltaic cell is capable of generating electrical current when electromagnetic radiation in the first wavelength range enters through the exposed surface and is incident on the at least one photovoltaic cell; at least one battery, where the at least one battery is operably connected to the at least one photovoltaic cell and capable of storing electrical charge from the electrical current generated by the at least one photovoltaic cell; and a light generating device, where the light generating device is operably connected to the at least one battery and capable of emitting electromagnetic radiation in a second wavelength range when powered by the at least one battery, where the apparatus is capable of having at least a first portion of the electromagnetic radiation in the second wavelength range exit the apparatus via a second surface, wherein at least a portion of the at least one photovoltaic cell is at least semi-transparent such that a portion of electromagnetic radiation in the first wavelength range incident on the at least a portion of the at least one photovoltaic cell passes through the at least a portion of the at least photovoltaic cell, wherein when the as apparatus is positioned such that the exposed surface is adjacent a first space from which the electromagnetic radiation in the first wavelength range enters the exposed surface and the second surface is adjacent a second space into which the electromagnetic radiation in the second wavelength range enters after passing through the second surface, wherein the apparatus is an interface between the first space and the second space. An absorptive/transmissive electrochromic device can be configured to modulate the light intensity emitted from the apparatus. A specific apparatus can incorporate a reflective/transmissive electrochromic device configured to allow electromagnetic radiation in the first wavelength range that enters the apparatus through the exposed surface to reach the at least one organic photovoltaic cell when the reflective/transmissive electrochromic device is in the transmissive state and to reflect electromagnetic radiation in the second wavelength range emitted away from the second surface back toward the second surface when the reflective/transmissive electrochromic device is in the reflective state. Preferably, the least a portion of the at least one photovoltaic cell that is at least semi-transparent is transparent. In a specific embodiment, the at least one photovoltaic cell is at least one organic photovoltaic cell.

At least a portion of the at least one light generating device is at least semi-transparent such that a portion of electromagnetic radiation in the first wavelength range incident on the at least a portion of the at least one light generating device passes through the at least a portion of the at least one light generating device that is at least semi-transparent. The at least one light generating device can be at least one organic light emitting device.

A controller can be used to regulate the electrical current passed from the at least one photovoltaic cell to the at least one battery and/or to regulate the electrical current passed from the at least one battery to the at least one light generating device. Preferably the at least one battery is at least one lithium ion battery. The lithium ion batteries can be located so as to not interfere with the light passing through the apparatus, for example during the day.

In a specific embodiment, the at least a portion of the at least one photovoltaic cell that is at least semi-transparent is transparent. Likewise, the at least a portion of the at least one light generating device that is at least semi-transparent can also be transparent. The at least one photovoltaic cell can be at least one organic photovoltaic cell.

In an embodiment, the electromagnetic radiation in the first wavelength range that enters the apparatus through the exposed surface is either absorbed in, or passes through, the at least one photovoltaic cell, and, if the electromagnetic radiation in the first wavelength range that enters the apparatus through the exposed surface passes through the at least one photovoltaic cell, the electromagnetic radiation then passes through the at least one organic light emitting device and exits the apparatus through the second surface.

The photovoltaic cell can have many shapes. In an embodiment, the at least one photovoltaic cell is planar. Likewise, the organic light emitting device can have many shapes. In an embodiment, the at least one organic light emitting device is planar. In a preferred embodiment, the at least one photovoltaic cell and at least one organic light emitting device are parallel, and can each lie in a plane or can follow a curve.

When the apparatus is positioned such that the exposed surface is adjacent a first space from which the electromagnetic radiation in the first wavelength range enters the exposed surface and the second surface is adjacent a second space into which the electromagnetic radiation in the second wavelength range enters after passing through the second surface, the apparatus can be an interface between the first space and the second space, such as a window.

It should be noted that this Brief Summary is provided to generally introduce the reader to one or more select concepts described below in the Detailed Disclosure in a simplified form. This Summary is not intended to identify key and/or required features of the claimed subject matter. The invention is defined by the claims below.

DETAILED DISCLOSURE

Figure 1:
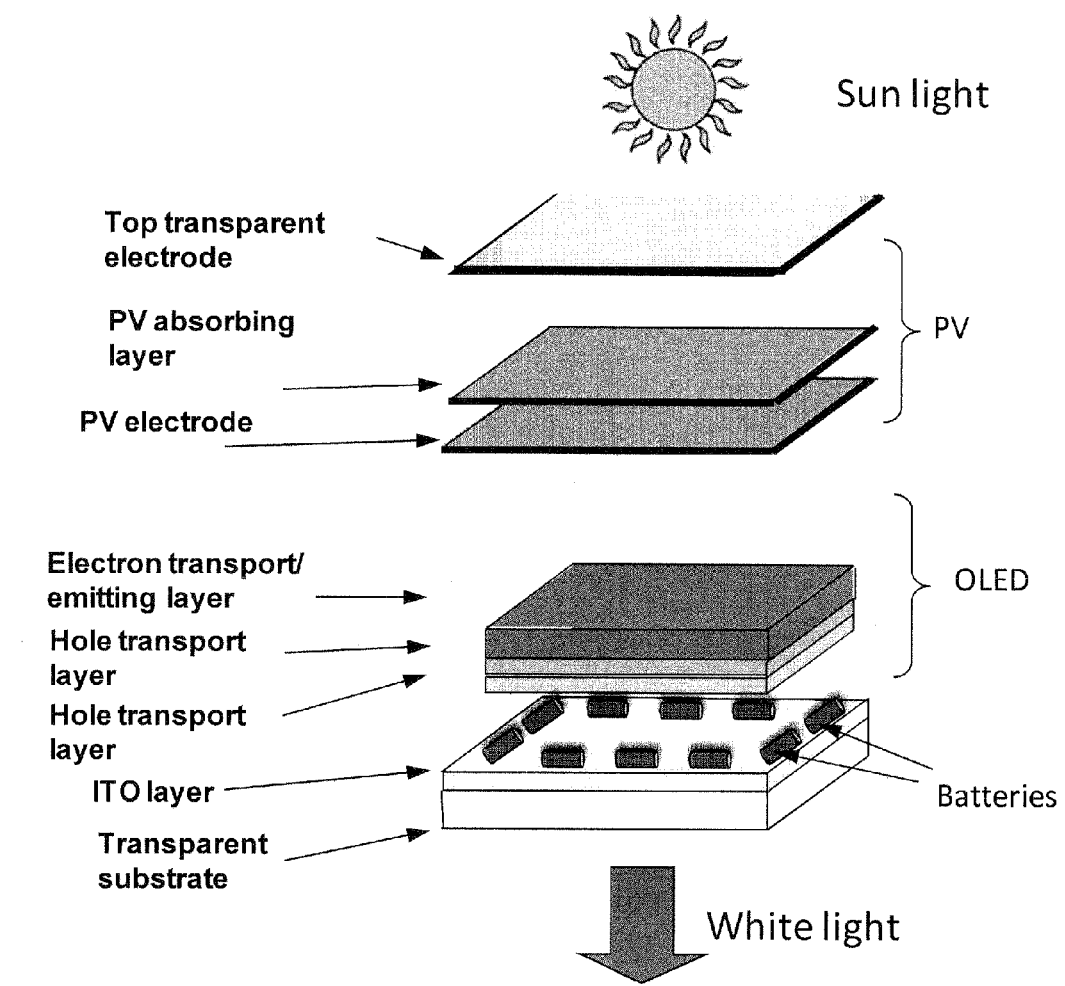
FIG. 1 shows an exploded view of a solar-powered lighting module in accordance with an embodiment of the subject invention.

Embodiments of the invention are directed to high-efficiency, solar-powered lighting. In an embodiment, a light generating device is provided. In another embodiment, a power generation device is provided. In a particular embodiment, the power generation device incorporates a solar cell. In yet another embodiment, an energy storage device is provided. In a particular embodiment, the energy storage device includes a battery.

In an embodiment, a solar-powered lighting module is provided, including a solar cell for generating electricity when exposed to light and a light generating device capable of being powered by the generated electricity. In a further embodiment, the module further includes a battery for storing charge from the generated electricity. In an embodiment, the module further includes a controller that regulates the current transmitted between the components of the module.

In an embodiment, an electricity generation module is provided, including a solar cell for generating electricity when exposed to light and a battery for storing charge from the generated electricity.

In another embodiment, a battery powered lighting module is provided, including a light generating device and a battery for powering the light generating device.

In further embodiments, a module, such as one or more of the modules discussed above or throughout the subject application, can serve as an interface between two environments. In a specific embodiment, a module can serve as an interface between the inside and outside of an environmentally controlled space. Such an environmentally controlled space may include an automobile, spacecraft, boat, ship, airplane, recreational or other vehicle; lab, factory, tent, shelter, train station, bus station, airport, store, restaurant, mall, greenhouse, office building, commercial, industrial, residential or other structure, both permanent and temporary. In specific embodiments, the environmentally controlled space can have one or more of the following controlled: light, humidity, contents (e.g., gases), and/or temperature. In an embodiment, the module is incorporated into a building interface, such as a window, skylight, or other interface, and can be positioned to light an interior portion of the building. In another embodiment, the solar cell and light generating device can be, partially or wholly, transparent to allow light to pass through the interface. In a further embodiment, tinted-color conjugated polymers incorporated into the module limit the spectrum of light that can pass through the interface. In an embodiment, the interface provides good thermal insulation and low sunlight transmission that further reduce the electricity required for heating and air conditioning the controlled space.

An embodiment relates to a method of manufacturing one or more modules, such as the modules discussed above or throughout the subject application. In a further embodiment, the one or more modules are incorporated into an interface.

Another embodiment relates to a method of modifying an existing interface, wherein one or more modules, such as the modules discussed above or throughout the subject application, are incorporated into the existing interface.

One or more modules, such as the modules discussed above or throughout the subject application, can be incorporated into a surface of an appliance, fixture, or work space. For example, a module may be incorporated into a counter, desk, sawhorse, workbench, cutting board, or other portable or fixed work surface; a refrigerated cabinet, dishwasher, pantry, oven, lab hood, or other appliance; a sign, monitor, or other visual display; or such other areas. In specific embodiments, it is desired to control light, humidity, contents (e.g., gases), and/or temperature in one or more spaces adjacent the module.

In an embodiment, the invention integrates a light generating device, a power generation device, and an energy storage device to create a lighting module. In an embodiment, the light generating device can be a light emitting device that incorporates organic materials, such as an organic light emitting device (OLED). In another embodiment, the power generation device can incorporate a solar cell, such as an organic photovoltaic (OPV) cell. In yet another embodiment, the energy storage device includes a battery, such as a lithium ion battery (LIB).

Additional embodiments relate to systems and/or methods of generating electricity and/or providing lighting using one or more modules, such as the modules discussed above. In an embodiment, the one or more modules are used to light a space. In an embodiment, the one or more modules are incorporated into an interface. In a further embodiment, the interface is an interface between two environments and the one or more modules are used to provide lighting in one of the two environments. In an embodiment, the one or more modules are used to provide lighting to both environments.

In an embodiment, the operation of the system and/or method is varied based on the presence or absence of one or more conditions. Various conditions can affect the operation of the system and/or method. For example, one or more conditions existing in the two environments separated by the interface can affect the operation of the system and/or method. In an embodiment, one or more conditions existing in either of the two environments affect the operation of the system and/or method. In another embodiment, one or more conditions existing in both of the two environments affect the operation of the system and/or method. In yet another embodiment, the presence or absence of a first set of conditions in a first environment of the two environments and the presence or absence of a second set of conditions in a second environment of the two environments affect the operation of the system and/or method. At least one sensor can be used to sense the one or more conditions. Such sensors can sense a variety of conditions, such as temperature, humidity, lighting, acidity, proximity of an object to a part of the system, and presence or movement of an object, among other conditions. In an embodiment, a solar cell incorporated into a module of the one or more modules can be used to sense lighting. Other sensors for sensing various conditions are known in the art and can be used with the subject invention.

FIG. 1 shows an exploded view of a solar-powered lighting module in accordance with an embodiment of the subject invention. As shown, the module includes a photovoltaic (PV) cell for collecting light energy from the sun and generating electricity, an OLED for producing light, batteries for storing electrical charge, and a substrate that allows at least some light to pass through.

Because of differences In the form factor, voltage, and current characteristics, physical integration of PV cells, batteries, and OLEDs can be designed and optimized. In an embodiment of the invention, both the PV cells and OLEDs are in the form of thin films, and the ultra-high energy LIB can be made into any custom shape. In an embodiment, the integrated module is realized by placing one or more LIBs around the periphery of the OPV/OLED panel. Such an integrated device can be used to store energy during the day and power the OLED panel for lighting in the evening. In an embodiment, the solar cells and OLED panels are at least semi-transparent so that the module can be incorporated into a skylight, window, or other building interface. In an embodiment, the module can act as a window during the day and an off-grid lighting panel during the night.

In an embodiment, large area OPV cells are used along with custom-shaped, high-volumetric-energy-density LIBs that can be recharged by solar power and sustain lighting at night for up to 8 hours. In a further embodiment, white light emitting OLEDs with power efficiency exceeding 100 lm/W are utilized. The selection and/or fabrication of suitable OPV cells, LIBs, and OLEDs are further discussed below.

The PV/LIB/OLED module can be designed and integrated to ensure optimum operation of all components. For example, in an embodiment, the entire system is operated at a voltage of approximately 4 volts, which is the operating voltage for both a single LIB and an OLED. In a further embodiment, a micro-charge controller is provided that optimizes battery charging conditions, ensures a constant charging current is maintained by the PV cells during operation, and prolongs battery life by protecting the battery from overcharging or discharge during PV operation.

In an embodiment, a solar-battery-powered lighting module is integrated into the form of a window or other interface, including polymeric photovoltaic materials, high efficiency transparent PV cells, high-volumetric-energy-density LIBs, and high-efficiency transparent white OLEDs. As discussed below, both OPV cells and OLEDs can be made in the form of thin films and ultra-high energy density LIBs can be made into any custom shape. Thus, a self-sustainable integrated PV/OLED module can be realized by placing the LIBs around the periphery of the lighting panel. Such an integrated device can be used to store energy during the day and power the lighting panel during the evening. As discussed below, both OPV cells and OLEDs can be made transparent. Thus, a self-encapsulated window can be realized.

In an embodiment, the module is incorporated into a single-pane window. In a particular embodiment, a PV layer can be bound to the exterior face of the window pane and an OLED layer can be bound to the interior face of the window pane. In another embodiment, the layers can be reversed with the PV layer on the interior face and the OLED layer on the exterior face. In yet another embodiment, the layers are positioned on the same face of the window and can be placed next to one another, on top of one another, overlapping, intermingled, or otherwise oriented on the face.

In another embodiment, the module adopts a multi-pane configuration having two or more panes of glass or other transparent substrate material. In the multi-pane configuration, the OLED and PV layers can be bound to the exterior or interior faces of any of the window panes. In a particular embodiment, the layers are bound to the same face of the same pane as discussed above. A multi-pane configuration of PV and OLED layers can be used for applications that serve as an interface between the inside and outside of a building, automobile, or any environmentally controlled space. The multi-pane configuration can offer distinct advantages to improve PV conversion efficiency, serve as a thermal insulating layer, protect the PV and OLED layers from environmental exposure, and/or improve the strength of the underlying surfaces and the system.

Figure 2:
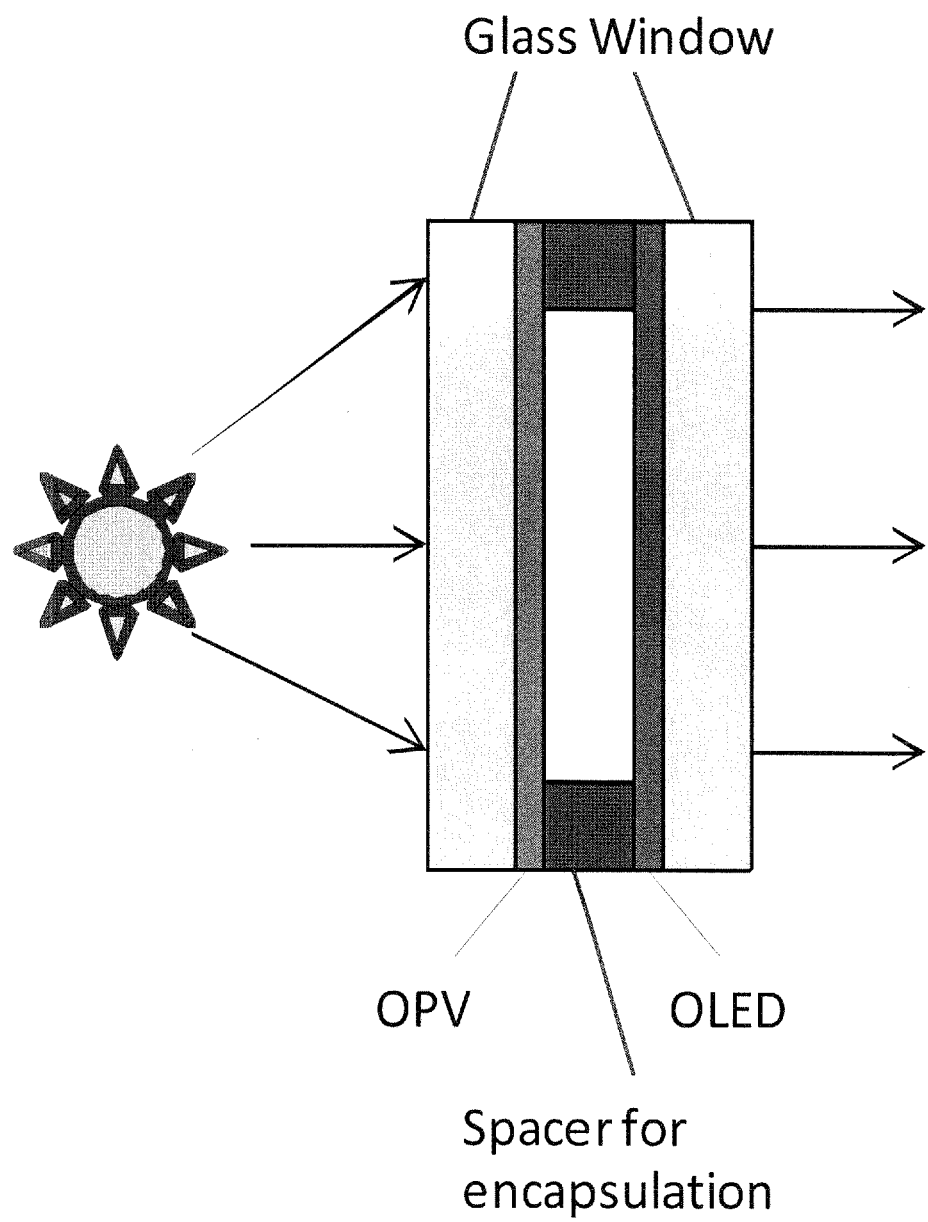
FIG. 2 shows a schematic drawing of a dual-pane solar-powered lighting window in accordance with an embodiment of the subject invention.

For example, FIG. 2 shows a schematic drawing of a dual-pane solar-powered lighting window in accordance with an embodiment of the subject invention. As shown, a multi-pane configuration can be designed to modify a traditional double-pane insulating window having two panes of glass separated by a gap of air, vacuum, or inert gas, or other material. In another embodiment, the glass panes are positioned next to each other with no gap or are separated by only one or more PV or OLED layers. As shown, the dual-pane system can be constructed as follows:

a. A PV layer can be applied to one glass pane (OPV Pane) and an OLED layer can be applied to a second glass pane (OLED Pane) during manufacture;

b. The PV Pane can be located so it is closer to an incident light source outside. The PV layer can be applied on the exterior glass but located on a side facing the gap. This configuration can protect the PV absorption layer from environmental exposure and chemicals used for cleaning the exterior windows; and c. The OLED Pane can be located so it is facing a space requiring light from the OLED Pane. The OLED coating can be applied on the interior glass surface but located on a side facing the gap as to protect the OLED lighting layer from interior exposure to chemicals used for cleaning the windows, etc.

In a further embodiment, a double-sided reflective layer (not shown) is applied to the innermost side of the PV layer or the OLED layer. This configuration can serve two purposes:

(1) to reflect more incident light back through the PV layer to increase photon-energy conversion efficiency of the PV cell; and (2) to reflect more light emitted by the OLED layer back into the interior (room). In an embodiment, one or more panes or coated panes increase the strength and impact resistance of the underlying glass substrate. In another embodiment, one or more panes or coated panes filter UV light coming into a building, automobile or other space using a reflective coating applied on an exterior or interior glass surface.

In yet another embodiment, one or more panes or coated panes act as an improved insulator to filter infrared light or heat entering a space using a reflective coating applied to the glass.

In still another embodiment of the subject invention, an electrochromic device (ECD) is provided capable of regulating the amount and quality of light it transmits, reflects, and/or absorbs. In a further embodiment of the subjection invention, an ECD cell is incorporated into one or more of the modules described herein and regulates the amount of light transmitted, reflected, and/or absorbed by the module. At least two ECD types, absorptive/transmissive (A/T) and reflective/transmissive (R/T), can be used with the subject invention to reduce the amount of light that is projected from a module. In the case of an R/T device, the ECD regulates the light intensity directed from the module. In the case of an A/T device, the ECD regulates the amount of light absorbed by the module.

Figure 3:
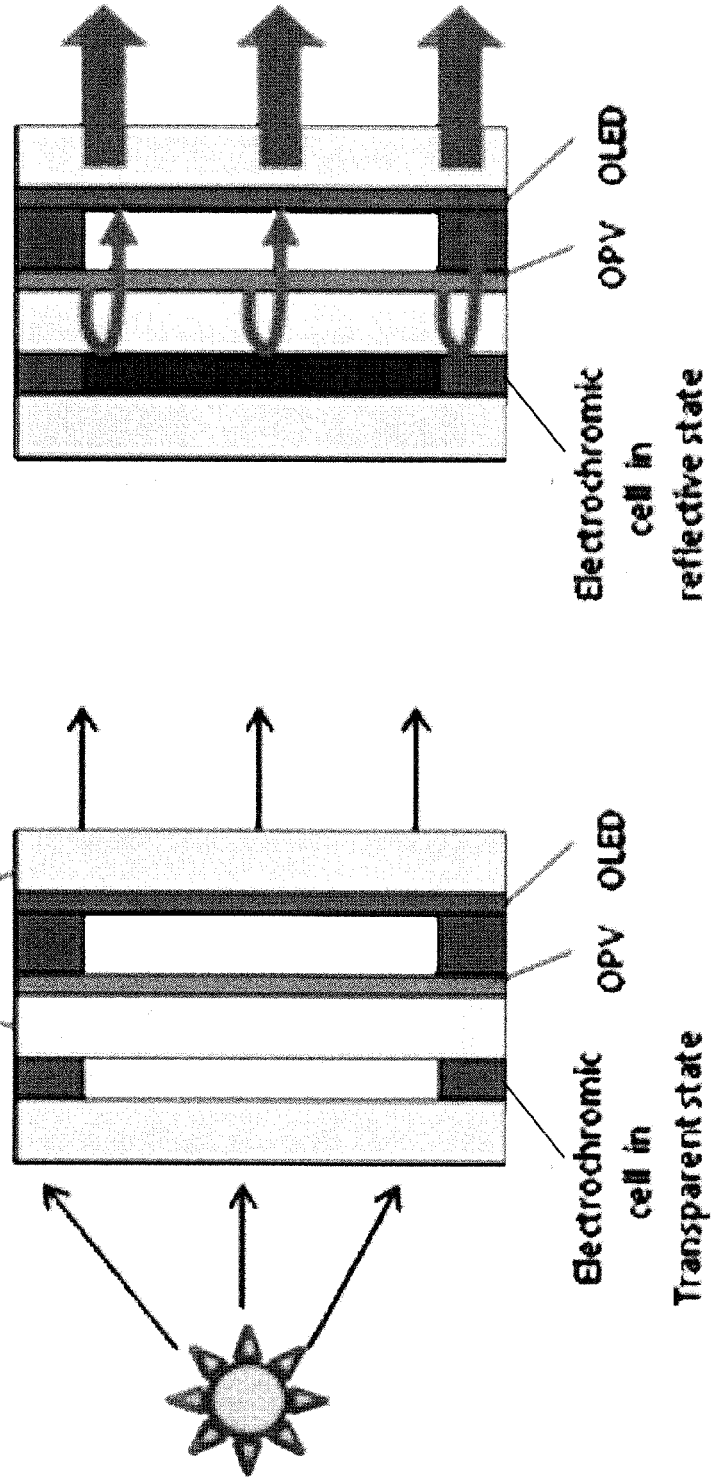
FIG. 3 shows a schematic drawing of a solar-powered lighting window incorporating an electrochromic cell in accordance with an embodiment of the subject invention.

The ECD can be used to absorb or direct light in a particular direction. For example, as shown in FIG. 3, an R/T ECD can be bound to an interface, such as a window, and used to selectively transmit or reflect light through the interface. For example, during daylight hours the RT/ECD may be configured to transmit light through the interface, such as from an exterior space through the interface toward an interior space. As shown, the light may pass through a solar cell, such as a OPV, or other panes or devices before entering the interior space. The operation of the R/T ECD can then be changed so that during the night the R/T ECD reflects light back into the interior space. As shown in FIG. 3, the light may pass through a solar cell, such as an OPV, or other panes or devices before entering the interior space.

FIG. 3 illustrates one embodiment of an interface incorporating an ECD. Various other embodiments will be obvious to one skilled in the art. For example, the ECD can be bound to either the interior or exterior faces of an interface to accomplish different lighting results. The ECD can be oriented in various ways with respect to an incorporated solar cell or OLED to achieve different results. For example, the ECD may be used to increase the intensity of light delivered to either side of a solar cell. The ECD can be incorporated into a multi-pane window and bound to any face of any one of the panes. In a particular embodiment, multiple ECDs are incorporated into a module or interface. In a further embodiment, both an R/T ECD and an A/T ECD are incorporated into a module to control both the absorption and reflection of light contacting the module.

In an A/T ECD device, a soluble organic electrochrome or conjugated polymer can undergo a switch from highly transmissive and colorless to highly absorptive. In the highly absorptive state, the ECD can be produce any color, and especially important for interface applications, nearly perfectly black for full visible light absorption. For example, during daytime operation the ECD can operate such that it will not impede light transmission to the solar cell, and therefore power generation, while at night the ECD can operate to prevent light from escaping through the interface. In an embodiment, the A/T ECD device operates at low voltage (1-2 volts) that can be easily attained from a LIB. In another embodiment, the A/T device continuously varies the optical density as a function of the applied voltage allowing light to be filtered as desired. In yet another embodiment, the A/T ECD device can operate with EC memory such that once a colored state is attained by the A/T device, based on voltage applied and a specific amount of charge passed, no further current is required to maintain that state beyond a minimal refreshing pulse (typically less than a 0.1 to 0.5% duty cycle).

In an embodiment of the subject invention, the organic electrochromes include those that are soluble and molecular, converted between neutral and ion-radical states. In this instance, color can be induced when current is running. For embodiments with EC memory, EC polymer films attached to the transparent electrodes can be utilized. In a particular embodiment of the invention, one or more of the SprayDOT™ family of polymers can provide a broad palette of colors while also switching to a highly transmissive state.

In an R/T ECD device, a metal electrodeposition cell can be used to create an internal mirror-like reflector that directs light in a particular direction. For example, in an embodiment of the subject invention, an R/T ECD device can be used to reflect OLED generated light back into a space to be lit. In a further embodiment, soluble metal salts that are fully transparent can be used in the R/T ECU device to reduce the device's hindering of light harvesting via a solar cell. As with embodiments of the A/T device described above, application of a small operating voltage (1-3 volts) to an R/T device can lead to electrochemical reduction of a metal ion at an internal transparent electrode, thus creating the reflector. Upon removal of the applied voltage, the reflector can be stable. In a further embodiment, again similar to the A/T ECD device, the R/T ECD device does not need a constant current for operation. Subsequent application of an oxidizing potential to the deposited metal film can lead to re-dissolution of the metal salt, and thus the device can regain its original transparency.

Both A/T and R/T type ECD devices have been shown to have sufficient switching and environmental stability for the subject applications. In a particular embodiment of the invention, polymer devices can be used that can cycle repeatedly, for example $10^5$ or more cycles. EC windows and mirrors based on organic electrochromes suitable for use with the subject invention are already commercially available (Gentex™, Boeing™) and have withstood outdoor weathering tests. In embodiments of the subject invention, metal reflector type devices are preferred because they are especially robust as both the metal salts and metal films themselves are highly light and heat stable.

Figure 4:
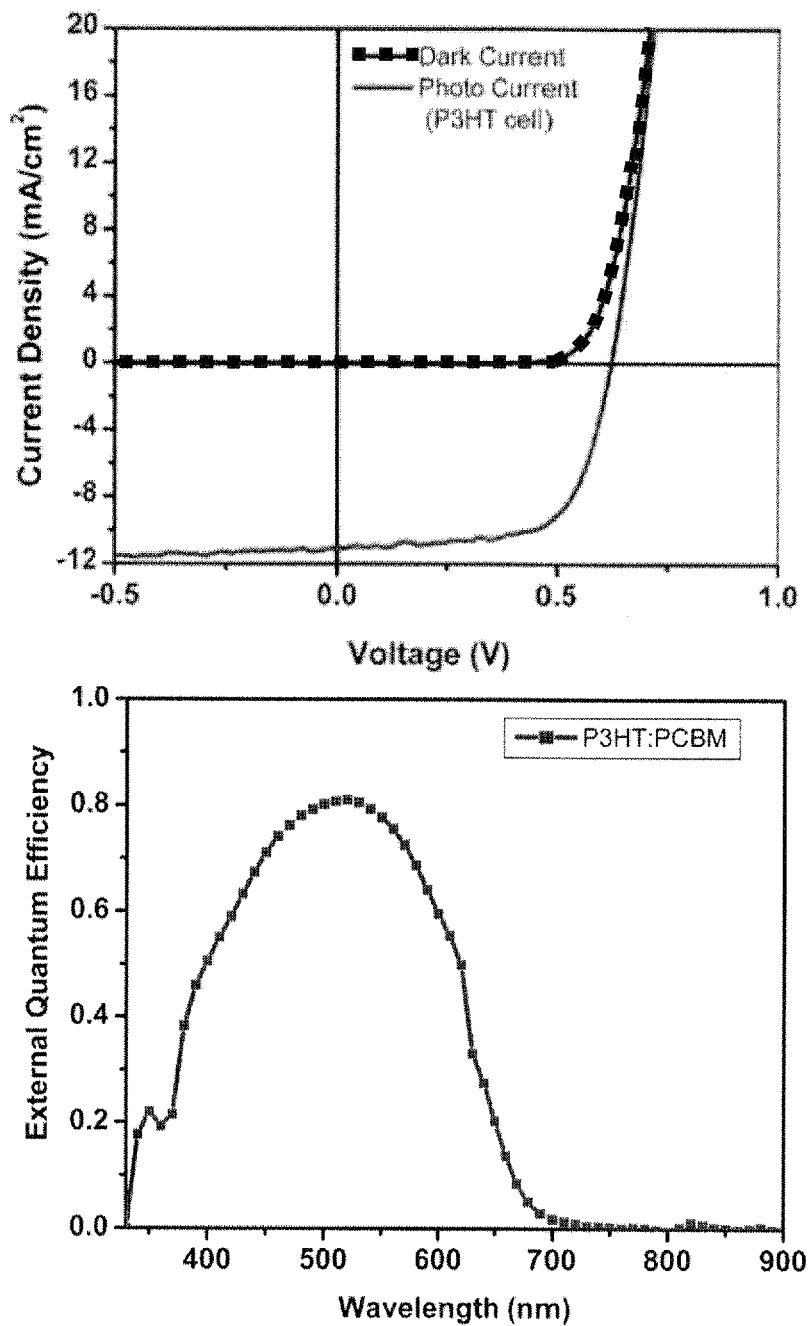
FIG. 4 shows photo-current voltage characteristics of a P3HT:PCBM PV cell (top) and external quantum efficiency as a function of wavelength (bottom) in accordance with an embodiment of the subject invention, where the dotted curve shows the dark current results and the solid curve shows the photo (P3HT) current results.

Thin, high-efficiency, transparent solar cells can be fabricated using polymeric materials specifically designed with the proper color tune and controlled molecular stacking to achieve high-efficiency tinted color PV cells. Organic PV technology can provide transparency. In terms of quantum efficiency, OPV s can be made as efficient as inorganic PV s. For example, as shown in FIG. 4, the peak quantum efficiency of poly 3-hexylthiophene (P3HT) blended with [6,6]-phenyl-C61 butyric acid methyl ester (PCBM) cells fabricated in accordance with an embodiment of the invention exceeded 80%. The dotted curve shows the dark current results and the solid curve shows the P3HT current results. The major difference between organic and inorganic cells is that organic materials have narrow absorption spectra compared with inorganic PV materials, and that is why most inorganic PV materials are opaque. On the other hand, most organic materials are colored and semi-transmissive which is ideal for tinted-color solar window applications. Solar polymeric materials can be fabricated that absorb the near-infrared (NIR) as well as part of the visible spectrum.

In an embodiment, conjugated polymeric materials with controlled molecular stacking and controlled absorption characteristics for tinted-color solar polymer applications are utilized in the solar cells. In a further embodiment, high efficiency transparent solar cells are created by incorporating high transparency top electrodes and an optimized donor-acceptor network.

The combination of electron rich polyheterocycles, with electron poor acceptor moieties, allows the synthesis of π-conjugated polymers with a full range of visible colors. As such, these polymers can be designed to absorb a controlled portion of the solar spectrum, along with the NIR, while transmitting certain colors and giving an aesthetically pleasing look to OPVs that are constructed with these materials.

Figure 5:
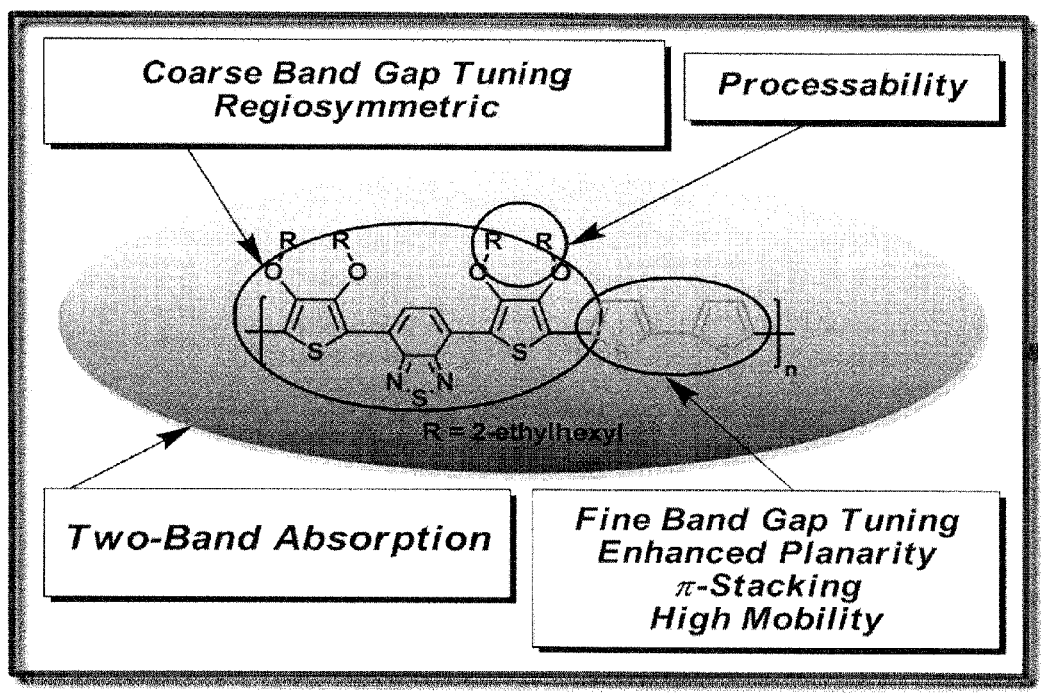
FIG. 5 shows a schematic demonstrating the donor-acceptor approach for producing a green colored, high mobility n-conjugated polymers for OPVs in accordance with an embodiment of the subject invention.

In an embodiment of the invention, highly efficient OPVs of varied color are fabricated for use with the subject invention. In an embodiment, the OPVs incorporate high hole mobility, processable and multi-colored polymers. For example, methods of deriving high hole mobility earth toned OPVs are described in U.S. Provisional Application 61/181, 131, filed May 26, 2009, which is incorporated herein by reference in its entirety. One example of an approach to producing a green-tinted solar polymer is demonstrated in FIG. 5. In this embodiment, first, the red portion of the structure sets up a donor-acceptor (D-A) interaction which leads to a two-band absorption spectrum. By designing these materials to absorb both the red and blue portions of the spectrum, the color green can be transmitted. Secondly, the blue portion of the structure represents the solubilizing ethylhexyl side groups that can provide solution processability. By controlling the length and branching of these side groups, the polymer packing can also be controlled to achieve ordered structures that enable high mobilities. In addition, the orange portion of the spectrum shows a bithiophene linkage between the D-A-D core that can induce a higher degree of conjugation and planarity, resulting in stacking in the overall polymer. This stacking, which has been demonstrated in dithienylsilole based polymers, can lead to large enhancements in hole mobility (up to $10^{-2}$ $cm^2V^{-1}s^{-1}$). Further detail on this approach is provided by U.S. Provisional Application 61/181, 058, filed May 26, 2009, which is incorporated herein by reference in its entirety.

Typically, OPV cells have an aluminum top electrode. One method of fabricating transparent PV cells is to replace the aluminum electrode with a transparent electrode. In an embodiment of the subject invention, a transparent top electrode is used that incorporates indium-tin oxide (ITO). In a further embodiment, a layered $CsCO_3$ (1 nm)/Ag (10 nm)/ITO (100 nm) electrode is used as the top electrode. The $CsCO_3$ interlayer lowers the cathode work-function to match the LUMO energy of PCBM. The thin Ag layer provides conductivity and the ITO layer provides encapsulation. Embodiments of this thin film stack have a 90% optical transmission and sheet resistance less than 5 ohm/sq, which is 70% lower than typical ITO electrodes. Similar transparent PV cells have performance very close to cells with an opaque electrode.

In addition to transparency, the donor-acceptor morphology can be optimized to achieve high efficiency. This can be done by optimizing the blend composition, as well as the annealing conditions, to achieve the optimum donor-acceptor phase separation.

Figure 6:
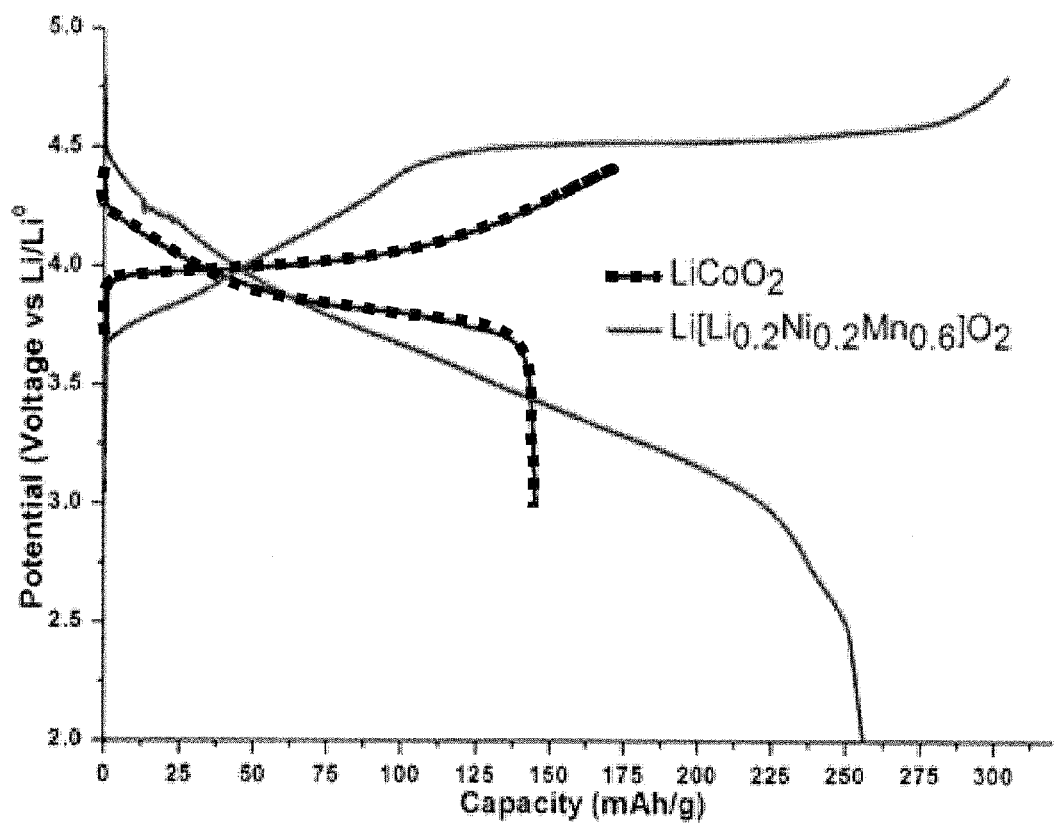
FIG. 6 shows a charge-discharge curve (solid) of a lithium ion cathode material in accordance with an embodiment of the subject invention and a dotted curve obtained from a commercial $LiCoO_2$ cathode used in conventional lithium ion batteries.

High-volumetric-energy-density, long-cycle-life batteries are preferably used as a storage component in embodiments of the solar-powered lighting module. Specific embodiments can incorporate electrodes based on Co-free, Ni- and Mn-containing Li transition metal oxides. This class of electrode materials has a composite 'layered-spinel' structure in nano-scale. Batteries made with these electrode materials offer nearly 50% more energy density than the batteries made with the current state-of-the art cathode materials. For example, FIG. 6 shows a charge-discharge curve (solid) of a lithium ion cathode material that can be used with specific embodiments of the invention. The dotted curve is obtained from a commercial $LiCoO_2$ cathode used in conventional LIBs, which can also be used with the invention. Due to the composite nature of the Co-free, Ni- and Mn-containing Li transition metal oxides electrode materials, their structural and electrochemical stability are much better than conventional layered oxides used in conventional LIBs.

White light emitting OLEDs with high power efficiency and a high color rendering index (>90) can be produced and are preferably used with the subject invention. White OLEDs with record power efficiency (>100 lm/W) can be used with embodiments of the subject invention. As further discussed below, transparent OLEDs can also be made.

Figure 7:
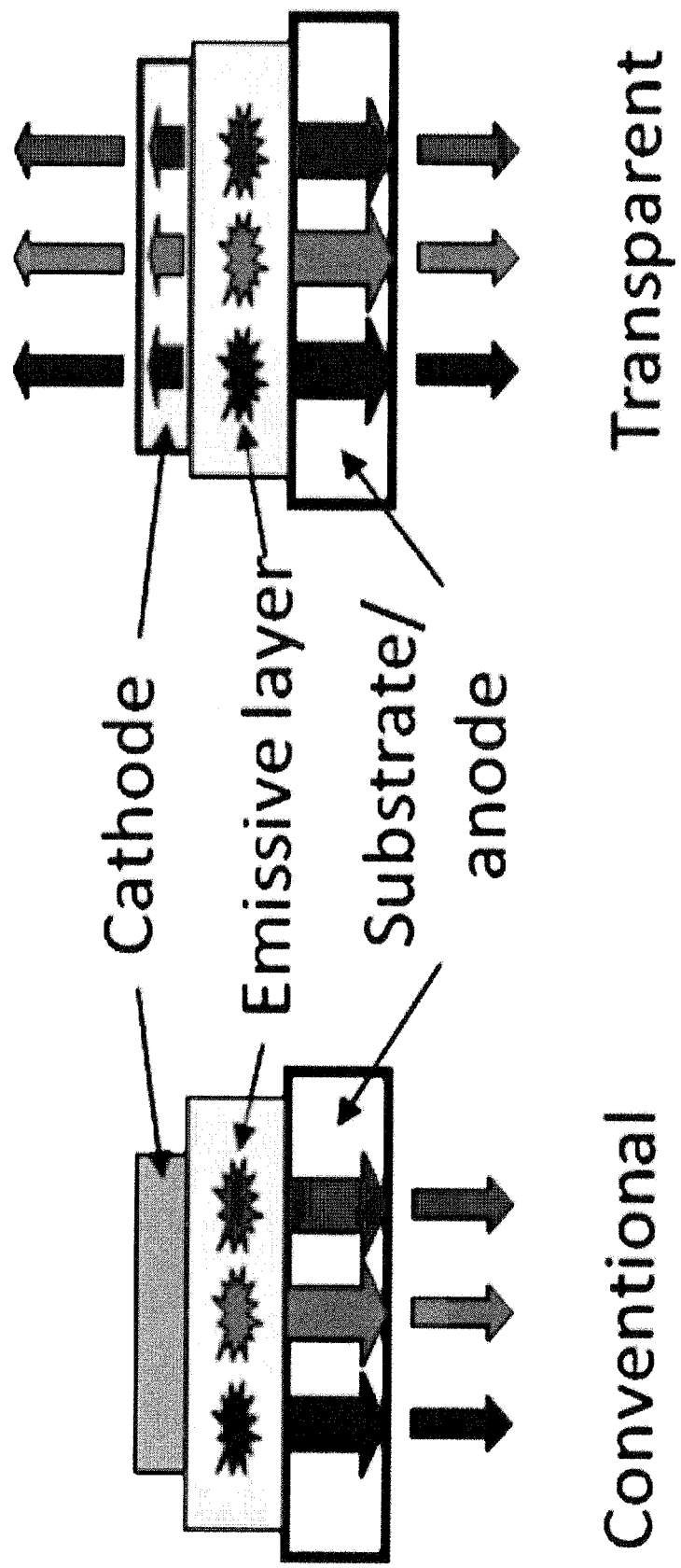
FIG. 7 shows a schematic drawing of a conventional (left) and transparent (right) white organic light-emitting device with a three-component (blue, green, and red) organic active layer in accordance with an embodiment of the subject invention.

FIG. 7 shows a schematic drawing of a conventional (left) and transparent (right) white organic light-emitting device with a three-component (blue, green, and red) organic active layer in accordance with an embodiment of the subject invention. For both devices, the organic emissive layer includes three different dye molecules emitting blue, green, and red lights, respectively. By controlling the relative abundance of the three dye molecules in the device, white light with high color rendering index >90 can be achieved. In another embodiment, different colors are achieved by varying the relative abundance of the three dye molecules or by varying the power transmitted to the different molecules.

For conventional OLEDs, a reflecting metal cathode (such as aluminum) is typically used. For transparent OLEDs, a transparent material (such as indium-tin oxide) can be used as the cathode. In this way, light emission can be seen from both sides of the device. The organic materials used in these devices are mostly transparent in the visible spectrum due to the high band gap of these materials (typically >3 eV). Exceptions can include the dye molecules from which the desired light emission is generated; however, the dye molecules can be incorporated as dopants (typical doping concentrations ~1-10 wt %) in the emissive layer whose thickness is typically 10-30 nm. Therefore, the entire OLED device can achieve a very high transparency of 90% or higher.

In fabricating transparent, white OLEDs with triple-doped organic emissive layers the damage to the underlying organic layers can be minimized during the sputter deposition of the indium-tin oxide transparent cathode, low sheet resistance and high transparency can be obtained for the transparent electrode, and efficient charge injection at the electrode/organic interface can be achieved. Similar to the transparent OPV cells discussed above, a composite electrode of CsCO3/Ag/ITO can also be used as the transparent electrode for the OLEDs. Furthermore, a microlens array can also be fabricated on the substrate surface to enhance the extraction of light in that direction. Moreover, OLEDs can be produced that offer high quality lighting with a color rendering index larger than 90, compared with the cold white color from fluorescent light tubes with a coloring rendering index of about 60. In a further embodiment, the OLEDs may be dimmed with the added benefit of achieving higher efficiencies at lower emission intensities.

The solar-powered lighting module can be designed and integrated to ensure optimum operation of all components. For example, in an embodiment the entire system is operated at a voltage of approximately 4 volts, which is the operating voltage for both a single LIB and an OLED. Because an OPV cell typically delivers an open-circuit voltage of 0.5-0.6 volts, 8 to 10 PV cells can be connected in series to provide a charging voltage required for the battery. An overlapping electrode design for multiple PV cells arranged in a side-by-side configuration can be employed to achieve the serial connections.

In a further embodiment, the battery charging characteristics of the system are also optimized using the PV cells as the power source and the discharging characteristics of the OLEDs as the load. In a preferred embodiment, load-matching is achieved among all components of the module to maximize the charging and discharging efficiencies of the batteries. To optimize the battery charging conditions, a micro-charge controller can be used with the subject invention to ensure a constant charging current being delivered by the solar cells is maintained during operation, prolonging the battery life by protecting the batteries from being overcharged and discharged during operation.

As discussed above, in an embodiment the solar-powered lighting module is integrated into a window. Assuming a window size of 4'×5' in a 10 ft×10 ft room, the total area of the window is 1.84 m$^2$. Because a typical window does not face the direct sunlight assume the window only receives half of the direct sunlight intensity, which corresponds to 500 W/m$^2$ of sunlight power. If the solar cell power conversion efficiency is just 5% and there are on the average of 6 hours of sunlight per day, the energy generated from the solar panel is 276 Watt-hours. If the battery storage and conversion efficiency is 80%, the input total input to the lighting module is 221 Watt-hours per day. Available OLEDs have a luminous efficiency above 100 lumens per watt; thus the total lumen output per day is 22,100 lumen-hours. Given that a typical 100 W incandescent light bulb has a lumen output of 1,500 lumens, 22,100 lumen-hours is equivalent to about IS lightbulb-hours. If the lighting module is required to operate 5 hours per day, the lutnen output from the OLED is equivalent to 3 100 Watt light bulbs operating for 6 hours per day in a 10 ft×10 ft room. The results of the calculation indicate that solar-powered lighting windows are capable of providing sufficient lumen requirements for room lighting.

In another embodiment of the subject invention, one or more of the modules described herein can be incorporated into a sign. The lighting and color characteristics determined by tinted-color conjugated polymers, ECDs, and/or OLEDs can be used to advertise messages. In a particular embodiment such a module is incorporated into a billboard that collects light energy during the day and displays a message at night, such as a lighted message. In another embodiment, a sign incorporating such a module can be displayed in a restaurant window, store front, or street sign.

In another embodiment of the subject invention, tinted-color conjugated polymers, colored OLEDs, and/or electrochromic polymers can be incorporated into a module, surface, or interface to generate different color light and therefore establish a desired lighting effect or mood for the occupant of a lit space.

In another embodiment of the subject invention, one or more of the modules described herein incorporates a capacitive, potentiometric, acoustic, infrared or other sensor and associated logic to determine the presence or absence of one or more conditions as discussed above. For example, the sensor and logic can determine if an occupant is in a room. In a further embodiment, the module can dim or turn off a light generating device when the occupant leaves the room. In another embodiment, the module can control an ECD to change the transparency of the interface when the occupant leaves the room. For example, the window could become opaque when the occupant leaves the room. In another embodiment of the subject invention, the light would dim, change color, or go out when the occupant issues a sound, command, touches the window, or other type of interaction with the module.

In another embodiment of the subject invention, a battery incorporated in one or more of the modules described herein can be charged externally through a Radio Frequency (RF) coupling or other means of transferring charge.

In another embodiment of the subject invention, one or more of the modules described herein are portable so that a user can move the module into the sunlight during the day and move it to another location to provide light at night. In a particular embodiment, the module produces a back-lit work surface.

In another embodiment of the subject invention, one or more of the modules described herein can be made of flexible plastic materials so that a user can charge it, move it, and bend/shape it to conform to his/her needs and surroundings for lighting.

In an embodiment, one or more of steps of a method for manufacturing one or more modules are performed by one or more suitably programmed computers. In a particular embodiment, deposition of material on a surface is controlled by the one or more suitably programmed computers. Computer-executable instructions for performing these steps can be embodied on one or more computer-readable media as described below. In an embodiment, the one or more suitably programmed computers comprise a processing system as described below.

In an embodiment, one or more steps of a method for generating electricity are performed by one or more suitably programmed computers. In a particular embodiment, the one or more suitably programmed computers process received signals from one or more sensors to determine the presence or absence of a condition. In another embodiment, the one or more suitably programmed computers control the operation of one or more components of a power generation device, such as a solar cell, energy storage device, sensor, controller, electrochromic device, and light emitting device, among other possible components. In a further embodiment, the one or more suitably programmed computers control the components based on the determined presence or absence of one or more conditions. Computer-executable instructions for performing these steps can be embodied on one or more computer-readable media as described below. In an embodiment, the one or more suitably programmed computers comprise a processing system as described below.

In an embodiment, one or more steps of a method for providing lighting are performed by one or more suitably programmed computers. In a particular embodiment, the one or more suitably programmed computers process received signals from one or more sensors to determine the presence or absence of a condition. In another embodiment, the one or more suitably programmed computers control the operation of one or more components of a light generating device, such as a light emitting device, energy storage device, sensor, controller, electrochromic device, and solar cell, among other possible components. In a further embodiment, the one or more suitably programmed computers control the components based on the determined presence or absence of one or more conditions. Computer-executable instructions for performing these steps can be embodied on one or more computer-readable media as described below. In an embodiment, the one or more suitably programmed computers comprise a processing system as described below.

Aspects of the invention can be described in the general context of computer-executable instructions, such as program modules, being executed by a computer. Generally, program modules include routines, programs, objects, components, data structures, etc., which perform particular tasks or implement particular abstract data types. Such program modules can be implemented with hardware components, software components, or a combination thereof. Moreover, those skilled in the art will appreciate that the invention can be practiced with a variety of computer-system configurations, including multiprocessor systems, microprocessor-based or programmable-consumer electronics, minicomputers, mainframe computers, and the like. Any number of computer systems and computer networks are acceptable for use with the present invention.

Specific hardware devices, programming languages, components, processes, protocols, formats, and numerous other details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention can be practiced without these specific details. Computer systems, servers, work stations, and other machines can be connected to one another across a communication medium including, for example, a network or networks.

As one skilled in the art will appreciate, embodiments of the present invention can be embodied as, among other things, a method, system, or computer-program product. Accordingly, the embodiments can take the form of a hardware embodiment, a software embodiment, or an embodiment combining software and hardware. In an embodiment, the present invention takes the form of a computer-program product that includes computer-usable instructions embodied on one or more computer-readable media. Methods, data structures, interfaces, and other aspects of the invention described above can be embodied in such a computer-program product.

Computer-readable media include both volatile and nonvolatile media, removable and nonremovable media, and contemplate media readable by a database, a switch, and various other network devices. By way of example, and not limitation, computer-readable media comprise media implemented in any method or technology for storing information. Examples of stored information include computer-usable instructions, data structures, program modules, and other data representations. Media examples include, but are not limited to, information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently. In an embodiment, non-transitory media are used.

The invention can be practiced in distributed-computing environments where tasks are performed by remote-processing devices that are linked through a communications network or other communication medium. In a distributed-computing environment, program modules can be located in both local and remote computer-storage media including memory storage devices. The computer-useable instructions form an interface to allow a computer to react according to a source of input. The instructions cooperate with other code segments or modules to initiate a variety of tasks in response to data received in conjunction with the source of the received data.

The present invention can be practiced in a network environment such as a communications network. Such networks are widely used to connect various types of network elements, such as routers, servers, gateways, and so forth. Further, the invention can be practiced in a multi-network environment having various, connected public and/or private networks.

Communication between network elements can be wireless or wireline (wired). As will be appreciated by those skilled in the art, communication networks can take several different forms and can use several different communication protocols.

Embodiments of the subject invention can be embodied in a processing system. Components of the processing system can be housed on a single computer or distributed across a network as is known in the art. In an embodiment, components of the processing system are distributed on computer-readable media. In an embodiment, a user can access the processing system via a client device. In an embodiment, some of the functions of the processing system can be stored and/or executed on such a device. Such devices can take any of a variety of forms. By way of example, a client device may be a desktop or laptop computer, a personal digital assistant (PDA), an MP3 player, a communication device such as a telephone, pager, email reader, or text messaging device, or any combination of these or other devices. In an embodiment, a client device can connect to the processing system via a network. As discussed above, the client device may communicate with the network using various access technologies, both wireless and wireline. Moreover, the client device may include one or more input and output interfaces that support user access to the processing system. Such user interfaces can further include various input and output devices which facilitate entry of information by the user or presentation of information to the user. Such input and output devices can include, but are not limited to, a mouse, touch-pad, touchscreen, or other pointing device, a keyboard, a camera, a monitor, a microphone, a speaker, a printer, and a scanner, among other such devices. As further discussed above, the client devices can support various styles and types of client applications.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An apparatus, comprising:
   an exposed surface, wherein the exposed surface is configured to allow electromagnetic radiation in a first wavelength range to enter the apparatus;
   at least one photovoltaic cell, wherein the at least one photovoltaic cell is configured to generate electrical current when electromagnetic radiation in the first wavelength range enters the apparatus through the exposed surface and enters the at least one photovoltaic cell, wherein at least a portion of the at least one photovoltaic cell is at least semi-transparent such that a portion of electromagnetic radiation in the first wavelength range that enters the at least a portion of the at least one photovoltaic cell passes through the at least a portion of the at least one photovoltaic cell and exits the at least one photovoltaic cell;

at least one battery, wherein the at least one battery is operably connected to the at least one photovoltaic cell and configured to store electrical charge from the electrical current generated by the at least one photovoltaic cell; and at least one light generating device, wherein the at least one light generating device is operably connected to the at least one battery and configured to emit electromagnetic radiation in a second wavelength range when powered by the at least one battery, wherein at least a portion of the at least one light generating device is at least semi-transparent such that a portion of electromagnetic radiation in the first wavelength range that enters the at least a portion of the at least one light generating device passes through the at least a portion of the at least one light generating device that is at least semi-transparent and exits the at least one light generating device, wherein the apparatus is configured such that at least a first portion of the electromagnetic radiation in the second wavelength range emitted by the at least one light generating device exits the apparatus via a second surface, wherein at least a portion of the electromagnetic radiation in the first wavelength range that enters the apparatus through the exposed surface passes through the at least a portion of the at least one photovoltaic cell that is at least semi-transparent, passes through the at least a portion of the at least one light generating device that is at least semi-transparent, and exits the apparatus via the second surface, wherein the first surface and the second surface are different surfaces.

2. The apparatus of claim 1, wherein the apparatus is configured such that at least a second portion of the electromagnetic radiation in the second wavelength range emitted by the at least one light generating device exits the apparatus via the exposed surface.

3. The apparatus of claim 1, wherein the first wavelength range is at least a portion of the sun's spectrum.

4. The apparatus of claim 1, wherein the apparatus is configured such that when the apparatus is positioned such that the exposed surface is adjacent a first space from which the electromagnetic radiation in the first wavelength range enters the exposed surface and the second surface is adjacent a second space into which the at least a first portion of the electromagnetic radiation in the second wavelength range enters after exiting the apparatus via the second surface, the apparatus is an interface between the first space and the second space.

5. The apparatus of claim 1, further comprising:
an absorptive/transmissive electrochromic device configured to modulate a light intensity of light emitted from the apparatus.

6. The apparatus of claim 1, further comprising:
a reflective/transmissive electrochromic device configured to allow electromagnetic radiation in the first wavelength range that enters the apparatus through the exposed surface to reach the at least one organic photovoltaic cell when the reflective/transmissive electrochromic device is in the transmissive state and to reflect electromagnetic radiation in the second wavelength range emitted by the at least one light generating device in a direction away from the second surface back toward the second surface when the reflective/transmissive electrochromic device is in the reflective state.

7. The apparatus of claim 1, wherein the at least a portion of the at least one photovoltaic cell that is at least semi-transparent is transparent.

8. The apparatus of claim 1, wherein the at least one photovoltaic cell comprises at least one organic photovoltaic cell.

9. The apparatus of claim 1, wherein the at least one light generating device comprises at least one organic light emitting device.

10. The apparatus of claim 1, further comprising a controller, wherein the controller regulates the electrical current generated by the at least one photovoltaic cell that is passed to the at least one battery.

11. The apparatus of claim 10, wherein the controller regulates an electrical current from the at least one battery that is passed to the at least one light generating device.

12. The apparatus of claim 1, wherein at least one battery comprises at least one lithium ion battery.

13. The apparatus of claim 9, wherein the at least a portion of the at least one photovoltaic cell that is at least semi-transparent is transparent.

14. The apparatus of claim 13, wherein the at least a portion of the at least one light generating device that is at least semi-transparent is transparent.

15. The apparatus of claim 14, wherein the at least one photovoltaic cell comprises at least one organic photovoltaic cell.

16. The apparatus of claim 1, wherein the electromagnetic radiation in the first wavelength range that enters the apparatus through the exposed surface and enters the at least one photovoltaic cell is either absorbed in, or passes through, the at least one photovoltaic cell, wherein at least a portion of the electromagnetic radiation in the first wavelength range that enters the apparatus through the exposed surface and enters the at least one photovoltaic cell, passes through the at least one photovoltaic cell, then passes through the at least one organic light emitting device and exits the apparatus through the second surface.

17. The apparatus of claim 15, wherein the at least one organic photovoltaic cell is planar.

18. The apparatus of claim 17, wherein the at least one organic light emitting device is planar.

19. The apparatus of claim 18, wherein the at least one photovoltaic cell and at least one organic light emitting device are parallel.

20. The apparatus of claim 19, wherein the apparatus is a window.

21. A method for lighting a space, comprising:
providing an apparatus adjacent to a first space,
wherein the apparatus comprises:
an exposed surface, wherein the exposed surface is configured to allow electromagnetic radiation in a first wavelength range to enter the apparatus;
at least one photovoltaic cell, wherein the at least one photovoltaic cell is configured to generate electrical current when electromagnetic radiation in the first wavelength range enters the apparatus through the exposed surface and enters the at least one photovoltaic cell, wherein at least a portion of the at least one photovoltaic cell is at least semi-transparent such that a portion of electromagnetic radiation in the first wavelength range that enters the at least a portion of the at least one photovoltaic cell passes through the at least a portion of the at least one photovoltaic cell and exits the at least one photovoltaic cell;
at least one battery, wherein the at least one battery is operably connected to the at least one photovoltaic cell and configured to store electrical charge from the electrical current generated by the at least one photovoltaic cell; and at least one light generating device, wherein the at least one light generating device is operatively connected to the at least one battery and configured to emit electromagnetic radiation in a second wavelength range when powered by the at least one battery, wherein at least a portion of the at least one light generating device is at least semi-transparent such that a portion of electromagnetic radiation in the first wavelength range that enters the at least a portion of the at least one light generating device passes through the at least a portion of the at least one light generating device that is at least semi-transparent and exits the at least one light generating device, wherein the apparatus is configured such that at least a first portion of the electromagnetic radiation in the second wavelength range emitted by the at least one light generating device exits the apparatus via a second surface; and illuminating the exposed surface with electromagnetic radiation in the first wavelength range from the first space, wherein the electromagnetic radiation in the second wavelength range that exits the apparatus via the second surface provides light to a second space.

22. The method of claim 21, wherein the apparatus is positioned between the first space and the second space, wherein at least a portion of the electromagnetic radiation in the first wavelength range that enters the apparatus from the first space through the exposed surface of the apparatus exits the apparatus through the second surface of the apparatus and provides light to the second space.

23. The method of claim 21, wherein the apparatus is configured such that at least a second portion of the electromagnetic radiation in the second wavelength range exits the apparatus via the exposed surface.

24. The method of claim 21, wherein the first wavelength range is at least a portion of the sun's spectrum.

25. The method of claim 21, wherein the apparatus is an interface between the first space and the second space.

26. The method of claim 21, wherein the apparatus further comprises an absorptive/transmissive electrochromic device configured to modulate a light intensity of light emitted from the apparatus.

27. The method of claim 21, wherein the apparatus further comprises a reflective/transmissive electrochromic device configured to allow electromagnetic radiation in the first wavelength range that enters the apparatus through the exposed surface to reach the at least one organic photovoltaic cell when the reflective/transmissive electrochromic device is in the transmissive state and to reflect electromagnetic radiation in the second wavelength range emitted by the at least one light generating device in a direction away from the second surface back toward the second surface when the reflective/transmissive electrochromic device is in the reflective state.

28. The method of claim 21, wherein the at least a portion of the at least one photovoltaic cell that is at least semi-transparent is transparent.

29. The method of claim 21, wherein the at least one photovoltaic cell comprises at least one organic photovoltaic cell.

30. The method of claim 21, wherein at least a portion of the at least one light generating device is at least semi-transparent such that a portion of electromagnetic radiation in the first wavelength range that enters the at least a portion of the at least one light generating device passes through the at least a portion of the at least one light generating device that is at least semi-transparent.

31. The method of claim 21, wherein the at least one light generating device comprises at least one organic light emitting device.

32. The method of claim 21, wherein the apparatus further comprises a controller, wherein the controller regulates the electrical current generated by the at least one photovoltaic cell that is passed to the at least one battery.

33. The method of claim 32, wherein the controller regulates an electrical current from the at least one battery that is passed to the at least one light generating device.

34. The method of claim 21, wherein the at least one battery comprises at least one lithium ion battery.

35. The method of claim 31, wherein the at least a portion of the at least one photovoltaic cell that is at least semi-transparent is transparent.

36. The method of claim 35, wherein the at least a portion of the at least one light generating device that is at least semi-transparent is transparent.

37. The method of claim 36, wherein the at least one photovoltaic cell comprises at least one organic photovoltaic cell.

38. The method of claim 21, wherein the electromagnetic radiation in the first wavelength range that enters the apparatus through the exposed surface and enters the at least one photovoltaic cell is either absorbed in, or passes through, the at least one photovoltaic cell, wherein at least a portion of the electromagnetic radiation in the first wavelength range that enters the apparatus through the exposed surface, enters the at least one photovoltaic cell, and passes through the at least one photovoltaic cell, then passes through the at least one organic light emitting device and exits the apparatus through the second surface.

39. The method of claim 37, wherein the at least one photovoltaic cell is planar.

40. The method of claim 39, wherein the at least one organic light emitting device is planar.

41. The method of claim 40, wherein the at least one photovoltaic cell and at least one organic light emitting device are parallel.

42. The method of claim 41, wherein the apparatus is a window.

43. The apparatus of claim 9, wherein the at least one photovoltaic cell and the at least one organic light emitting device are in a form of thin films.

44. The method of claim 31, wherein the at least one photovoltaic cell and the at least one organic light emitting device are in a form of thin films.

45. The apparatus of claim 43, wherein the at least one photovoltaic cell and the at least one organic light emitting device are positioned on a face of a window.

46. The method of claim 44, wherein the at least one photovoltaic cell and the at least one organic light emitting device are positioned on a face of a window.

47. The apparatus of claim 1, wherein the at least one photovoltaic cell and the at least one organic light emitting device are made of flexible plastic materials, wherein the apparatus is bendable.

48. The method of claim 1, wherein the at least one photovoltaic cell and the at least one organic light emitting device are made of flexible plastic materials, wherein the apparatus is bendable, wherein the method further comprises bending the apparatus, wherein bending the apparatus alters an output light pattern of the at least a first portion of the electromagnetic radiation in the second wavelength range emitted by the at least one light generating device.

49. A method, comprising:
  providing an apparatus, wherein the apparatus comprises:
    an exposed surface, wherein the exposed surface is configured to allow electromagnetic radiation in a first wavelength range to enter the apparatus;
    at least one photovoltaic cell, wherein the at least one photovoltaic cell is configured to generate electrical current when electromagnetic radiation in the first wavelength range enters the apparatus through the exposed surface and enters the at least one photovoltaic cell, wherein at least a portion of the at least one photovoltaic cell is at least semi-transparent such that a portion of electromagnetic radiation in the first wavelength range that enters the at least a portion of the at least one photovoltaic cell passes through the at least a portion of the at least one photovoltaic cell and exits the at least one photovoltaic cell;
    at least one battery, wherein the at least one battery is operably connected to the at least one photovoltaic cell and configured to store electrical charge from the electrical current generated by the at least one photovoltaic cell; and
    at least one light generating device, wherein the at least one light generating device is operably connected to the at least one battery and configured to emit electromagnetic radiation in a second wavelength range when powered by the at least one battery, wherein at least a portion of the at least one light generating device is at least semi-transparent such that a portion of electromagnetic radiation in the first wavelength range that enters the at least a portion of the at least one light generating device passes through the at least a portion of the at least one light generating device that is at least semi-transparent and exits the at least one light generating device,
  wherein the apparatus is configured such that at least a first portion of the electromagnetic radiation in the second wavelength range emitted by the at least one light generating device exits the apparatus via a second surface,
  wherein at least a portion of the electromagnetic radiation in the first wavelength range that enters the apparatus through the exposed surface passes through the at least a portion of the at least one photovoltaic cell that is at least semi-transparent, passes through the at least a portion of the at least one light generating device that is at least semi-transparent, and exits the apparatus via the second surface,
  wherein the first surface and the second surface are different surfaces;
  exposing the exposed surface with electromagnetic radiation in the first wavelength range; and
  producing electromagnetic radiation in the second wavelength range that exits the apparatus via the second surface.

* * * * *

UNITED STATES PATENT AND TRADEMARK OFFICE
CERTIFICATE OF CORRECTION

PATENT NO. : 8,950,886 B2  Page 1 of 1
APPLICATION NO. : 13/319981
DATED : February 10, 2015
INVENTOR(S) : Meng et al.

It is certified that error appears in the above-identified patent and that said Letters Patent is hereby corrected as shown below:

In the Specification

Column 1,
Line 4, "APPLICATION APPLICATIONS" should read --APPLICATIONS--.

Column 10,
Line 26, "ECU" should read --ECD--.
Line 55, "OPV s" should read --OPVs--.
Line 55, "PV s." should read --PVs.--.

Column 12,
Line 54, "CsCO3/" should read --$CsCO_3$/--.

Column 13,
Line 36, "about IS" should read --about 15--.
Line 38, "lutnen" should read --lumen--.

Signed and Sealed this
Twenty-ninth Day of September, 2015

Michelle K. Lee
*Director of the United States Patent and Trademark Office*